US008569769B2

(12) United States Patent
Hwang et al.

(10) Patent No.: US 8,569,769 B2
(45) Date of Patent: Oct. 29, 2013

(54) E-MODE HIGH ELECTRON MOBILITY TRANSISTORS AND METHODS OF MANUFACTURING THE SAME

(75) Inventors: In-jun Hwang, Hwaseong-si (KR); Ki-ha Hong, Cheonan-si (KR); Jong-seob Kim, Hwaseong-si (KR); Jae-Kwang Shin, Anyang-si (KR); Jae-joon Oh, Seongnam-si (KR); Jong-bong Ha, Daegu (KR); Hyuk-soon Choi, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/179,859

(22) Filed: Jul. 11, 2011

(65) Prior Publication Data
US 2012/0112202 A1 May 10, 2012

(30) Foreign Application Priority Data

Nov. 5, 2010 (KR) ........................ 10-2010-0109783

(51) Int. Cl.
*H01L 29/15* (2006.01)
(52) U.S. Cl.
USPC 257/76; 257/194; 257/E29.246; 257/E21.403; 438/167; 438/168; 438/169; 438/171; 438/172
(58) Field of Classification Search
USPC .......................................................... 257/76
See application file for complete search history.

(56) References Cited

U.S. PATENT DOCUMENTS

| | | | |
|---|---|---|---|
| 5,262,660 A | 11/1993 | Streit et al. | |
| 6,281,528 B1 * | 8/2001 | Wada | 257/200 |
| 6,365,925 B2 * | 4/2002 | Hase et al. | 257/194 |
| 6,410,947 B1 * | 6/2002 | Wada | 257/194 |
| 6,521,961 B1 * | 2/2003 | Costa et al. | 257/402 |
| 7,566,918 B2 * | 7/2009 | Wu et al. | 257/194 |
| 7,692,298 B2 * | 4/2010 | Otsuka et al. | 257/745 |
| 7,800,116 B2 * | 9/2010 | Murata et al. | 257/76 |
| 7,851,825 B2 * | 12/2010 | Suh et al. | 257/194 |
| 7,859,021 B2 * | 12/2010 | Kaneko | 257/194 |
| 7,915,643 B2 * | 3/2011 | Suh et al. | 257/194 |
| 7,985,987 B2 * | 7/2011 | Kaneko | 257/194 |
| 8,237,198 B2 * | 8/2012 | Wu et al. | 257/194 |
| 2001/0013604 A1 * | 8/2001 | Hase | 257/12 |
| 2002/0167023 A1 * | 11/2002 | Chavarkar et al. | 257/194 |
| 2003/0080348 A1 * | 5/2003 | Inai et al. | 257/192 |
| 2003/0102482 A1 * | 6/2003 | Saxler | 257/85 |

(Continued)

FOREIGN PATENT DOCUMENTS

| | | |
|---|---|---|
| JP | 2008153330 A | 7/2008 |
| JP | 2008210836 A | 9/2008 |

(Continued)

*Primary Examiner* — N Drew Richards
*Assistant Examiner* — Ankush Singal
(74) *Attorney, Agent, or Firm* — Harness, Dickey & Pierce, P.L.C.

(57) ABSTRACT

An Enhancement-mode (E-mode) high electron mobility transistor (HEMT) includes a channel layer with a 2-Dimensional Electron Gas (2DEG), a barrier layer inducing the 2DEG in the channel layer, source and drain electrodes on the barrier layer, a depletion layer on the barrier layer between the source and drain electrodes, and a gate electrode on the depletion layer. The barrier layer is recessed below the gate electrode and the depletion layer covers a surface of the recess and extends onto the barrier layer around the recess.

18 Claims, 8 Drawing Sheets

(56) References Cited

U.S. PATENT DOCUMENTS

| | | | |
|---|---|---|---|
| 2005/0189561 A1* | 9/2005 | Kinzer et al. | 257/192 |
| 2005/0194612 A1* | 9/2005 | Beach | 257/192 |
| 2006/0060871 A1* | 3/2006 | Beach | 257/94 |
| 2006/0108659 A1* | 5/2006 | Yanagihara et al. | 257/471 |
| 2006/0124962 A1* | 6/2006 | Ueda et al. | 257/192 |
| 2006/0157729 A1* | 7/2006 | Ueno et al. | 257/103 |
| 2006/0220165 A1* | 10/2006 | Hase | 257/471 |
| 2007/0138517 A1* | 6/2007 | Nomoto | 257/288 |
| 2007/0158692 A1* | 7/2007 | Nakayama et al. | 257/213 |
| 2007/0194354 A1* | 8/2007 | Wu et al. | 257/288 |
| 2007/0278518 A1* | 12/2007 | Chen et al. | 257/192 |
| 2007/0284653 A1* | 12/2007 | Ueno et al. | 257/324 |
| 2008/0006845 A1* | 1/2008 | Derluyn et al. | 257/192 |
| 2008/0093626 A1* | 4/2008 | Kuraguchi | 257/190 |
| 2008/0105902 A1* | 5/2008 | Twynam | 257/200 |
| 2008/0157121 A1* | 7/2008 | Ohki | 257/194 |
| 2008/0296618 A1* | 12/2008 | Suh et al. | 257/190 |
| 2008/0308813 A1* | 12/2008 | Suh et al. | 257/76 |
| 2009/0032879 A1* | 2/2009 | Kuraguchi | 257/368 |
| 2009/0045438 A1* | 2/2009 | Inoue et al. | 257/192 |
| 2009/0072269 A1* | 3/2009 | Suh et al. | 257/136 |
| 2009/0146185 A1* | 6/2009 | Suh et al. | 257/194 |
| 2009/0230482 A1* | 9/2009 | Kato et al. | 257/392 |
| 2009/0250767 A1* | 10/2009 | Nomura et al. | 257/392 |
| 2009/0267078 A1* | 10/2009 | Mishra et al. | 257/76 |
| 2010/0090225 A1* | 4/2010 | Sato | 257/76 |
| 2010/0155720 A1* | 6/2010 | Kaneko | 257/43 |
| 2010/0163928 A1* | 7/2010 | Imada et al. | 257/194 |
| 2010/0219452 A1* | 9/2010 | Brierley | 257/194 |
| 2010/0264461 A1* | 10/2010 | Rajan et al. | 257/194 |
| 2011/0006346 A1* | 1/2011 | Ando et al. | 257/192 |
| 2011/0049526 A1* | 3/2011 | Chu et al. | 257/76 |
| 2011/0062438 A1* | 3/2011 | Kaneko | 257/43 |
| 2011/0079771 A1* | 4/2011 | Kanamura et al. | 257/24 |

FOREIGN PATENT DOCUMENTS

| | | | |
|---|---|---|---|
| JP | 2009054807 A | | 3/2009 |
| JP | 2010010584 A | * | 1/2010 |
| JP | 2010050347 A | | 3/2010 |
| JP | 2010153748 A | | 7/2010 |
| KR | 20010052109 A | | 6/2001 |
| KR | 20090029897 A | | 3/2009 |

* cited by examiner (a)

(b)

E-MODE HIGH ELECTRON MOBILITY TRANSISTORS AND METHODS OF MANUFACTURING THE SAME

CROSS-REFERENCE TO RELATED APPLICATION

This application claims priority under 35 U.S.C. §119 to Korean Patent Application No. 10-2010-0109783, filed on Nov. 5, 2010, in the Korean Intellectual Property Office (KIPO), the entire contents of which is incorporated herein by reference.

BACKGROUND

1. Field

Example embodiments relate to power devices, and more particularly, to Enhancement-mode (E-mode) high electron mobility transistors (HEMTs) and methods of manufacturing the same.

2. Description of the Related Art

A HEMT includes a 2-Dimensional Electron Gas (2DEG) in a channel layer. The 2DEG arises due to a band gap and/or polarizability difference between two layers. For example, a high band gap material may supply carriers to a lower band gap channel layer. The 2DEG is induced at or near the heterojunction of the two layers. Accordingly, the HEMT may include a high mobility channel.

A HEMT may be manufactured as an enhancement mode device in which the HEMT is in a normally off state without applied bias. A normally off HEMT may be manufactured such that a 2DEG is removed from below a gate. Accordingly, the HEMT may operate in an E-mode and its insulation break down voltage may be increased. There are various methods of removing the 2DEG from the channel layer. For example, representative methods include a recess method and a method using a p-GaN layer.

The recess method of manufacturing an E-mode HEMT includes forming a recess at a portion of an AlGaN barrier layer that forms 2DEG in a channel layer. The portion with a recess is an area where a gate electrode is to be formed. With respect to the recess method, damage may occur in a channel layer during processing to form a recess in an AlGaN barrier layer. Additionally, in the case of a recess process for forming an E-mode HEMT with a higher threshold voltage than about 1 V, an on-current of the HEMT may be reduced to less than half.

The method of manufacturing an E-mode HEMT using a p-GaN layer includes forming a p-GaN layer between a gate electrode and an AlGaN barrier layer. With respect to the method using a p-GaN layer, a thickness of an AlGaN barrier layer may be restricted. The thickness of the AlGaN barrier layer should be thin to remove the 2DEG from a channel layer below a gate electrode. However, when the thickness of the AlGaN barrier layer is thin, a concentration of the 2DEG may be reduced in another region of the channel layer outside a region below the gate electrode and an on-current of the HEMT may be reduced.

SUMMARY

Example embodiments may provide Enhancement-mode (E-mode) high electron mobility transistors (HEMT) and methods of manufacturing E-mode HEMTs.

According to example embodiments a HEMT includes a channel layer including 2-Dimensional Electron Gas (2DEG), a barrier layer causing the 2DEG in the channel layer, source and drain electrodes disposed on the barrier layer, a depletion layer disposed on the barrier layer between the source and drain electrodes, and a gate electrode disposed on the depletion layer. The barrier layer has a recess below the gate electrode and the depletion layer covers a surface of the recess and extends on the barrier layer around the recess.

The barrier layer may be a double layer. A thickness of a portion having the recess of the barrier layer may be in the range of about 5 nm to about 20 nm. The depletion layer may be a p-type semiconductor layer or a dielectric layer. The double layer may have respectively different polarization rates. The barrier layer may be an AlN layer, an AlGaN layer, an AlInN layer, an AlInGaN layer and combination layers thereof. The depletion layer may be a GaN layer, an InN layer, an AlGaN layer, an AlInN layer, an InGaN layer and/or an AlInGaN layer. The depletion layer may be a p-doped layer. The gate electrode may be a p-metal or nitride electrode.

According to other example embodiments, a method of manufacturing a HEMT includes forming a channel layer on a lower layer, forming a barrier layer causing 2DEG in the channel layer thereon, forming a recess in a portion of the barrier layer, forming a depletion layer disposed on the barrier layer, covering a surface of the recess, and extending to around the recess, forming source and drain electrodes on the barrier layer, and forming a gate electrode on the depletion layer.

The lower layer may include a sequentially-stacked substrate, seed layer, and buffer layer. The forming of the barrier layer may include forming a first barrier layer on the channel layer and forming a second barrier layer on the first barrier layer. A polarization rate of the second barrier layer is greater than that of the first barrier layer.

The barrier layer may be formed with a thickness of more than about 20 nm to less than about 100 nm. A portion having the recess of the barrier layer may have a thickness of about 5 nm to about 20 nm. The forming of the recess may include removing a portion of the second barrier layer corresponding to the gate electrode. The source and drain electrodes may be formed not to contact the depletion layer.

According to still other example embodiments, a method of manufacturing a HEMT includes forming a channel layer on a lower layer, forming a first barrier layer causing 2DEG in the channel layer thereon, forming a depletion layer on a partial region of the first barrier layer, growing the first barrier layer around the depletion layer, forming source and drain electrodes on the grown first barrier layer, and forming a gate electrode on the depletion layer.

The forming of the depletion layer on the partial region of the first barrier layer may include forming a depletion layer covering a top surface of the first barrier layer and patterning the depletion layer covering the top surface. The first barrier layer may be formed with a thickness of about 5 nm to about 20 nm. A thickness of the grown first barrier layer around the depletion layer may be in the range of more than about 20 nm to less than about 100 nm.

According to at least one example embodiment, a High Electron Mobility Transistor (HEMT) includes a channel layer with a 2-Dimensional Electron Gas (2DEG), a barrier layer configured to induce the 2DEG in the channel layer, the barrier layer including a recess region, source and drain electrodes on the barrier layer, a depletion layer on the barrier layer between the source and drain electrodes, the depletion layer covering a surface of the barrier layer in the recess region and extending onto a region of the barrier layer outside the recess region, and a gate electrode on the depletion layer in the recess region.

According to at least one example embodiment, a method of manufacturing a high electron mobility transistor (HEMT) includes forming a channel layer, forming a barrier layer to induce a two-dimensional electron gas (2DEG) in the channel layer, forming a recess in the barrier layer, forming a depletion layer to cover a surface of the barrier layer in the recess and to extend onto regions of the barrier layer adjacent to the recess, forming source and drain electrodes on the barrier layer, and forming a gate electrode on the depletion layer.

According to at least one example embodiment, a method of manufacturing a high electron mobility transistor (HEMT) includes forming a channel layer, forming a first barrier layer to induce a two-dimensional electron gas (2DEG) in the channel layer, forming a depletion layer pattern on the first barrier layer, growing a second barrier layer on the first barrier layer around the depletion layer pattern, forming source and drain electrodes on the second barrier layer and forming a gate electrode on the depletion layer pattern.

BRIEF DESCRIPTION OF THE DRAWINGS

Example embodiments will be more clearly understood from the following brief description taken in conjunction with the accompanying drawings.

FIGS. 1-4 are cross-sectional diagrams illustrating methods of manufacturing Enhancement-mode (E-mode) high electron mobility transistors (HEMTs) according to example embodiments;

FIGS. 5 and 6 are cross-sectional diagrams illustrating HEMTs including a double-layer barrier layer manufactured according to methods described with respect to FIGS. 1-4;

FIG. 7 is a diagram illustrating energy level changes of a barrier layer and a channel layer according to the presence of a depletion layer and a thickness of the barrier layer;

FIGS. 8-11 are cross-sectional diagrams illustrating methods of manufacturing E-mode HEMTs according to other example embodiments; and FIGS. 12 and 13 are diagrams illustrating a T-CAD simulation result with respect to the HEMT of FIG. 6.

Figure 1:
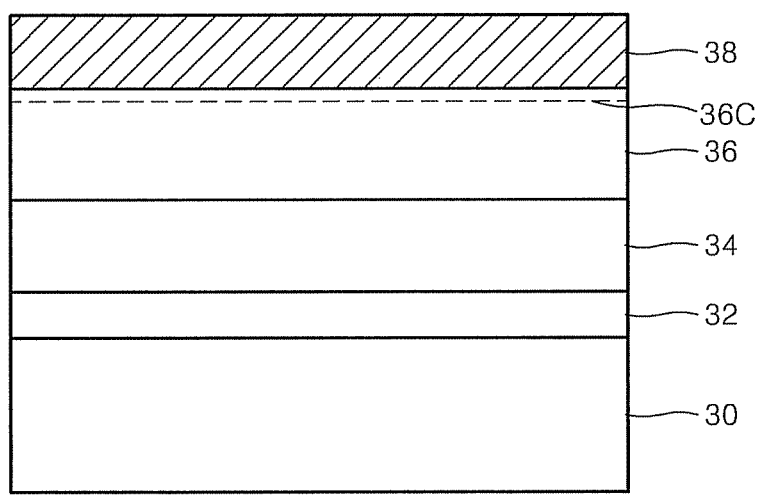
FIGS. 1-13 represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
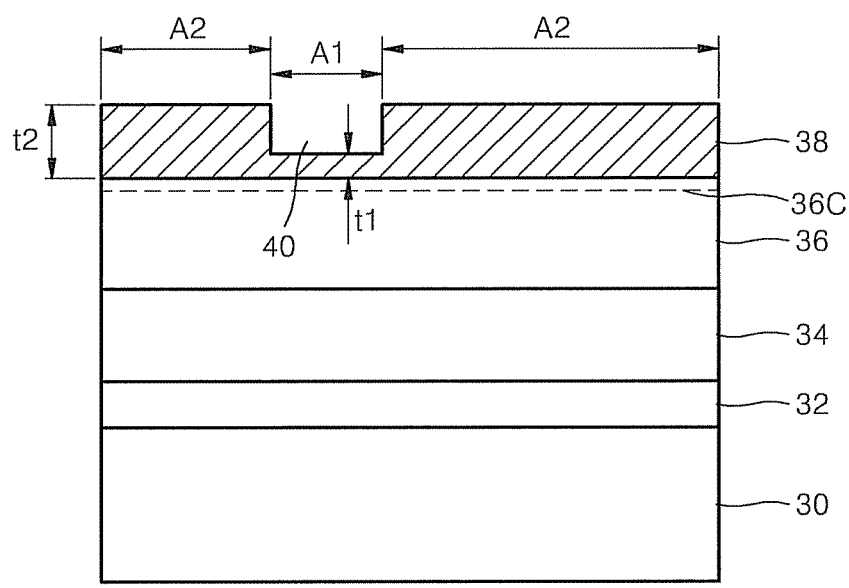
Figure 3:
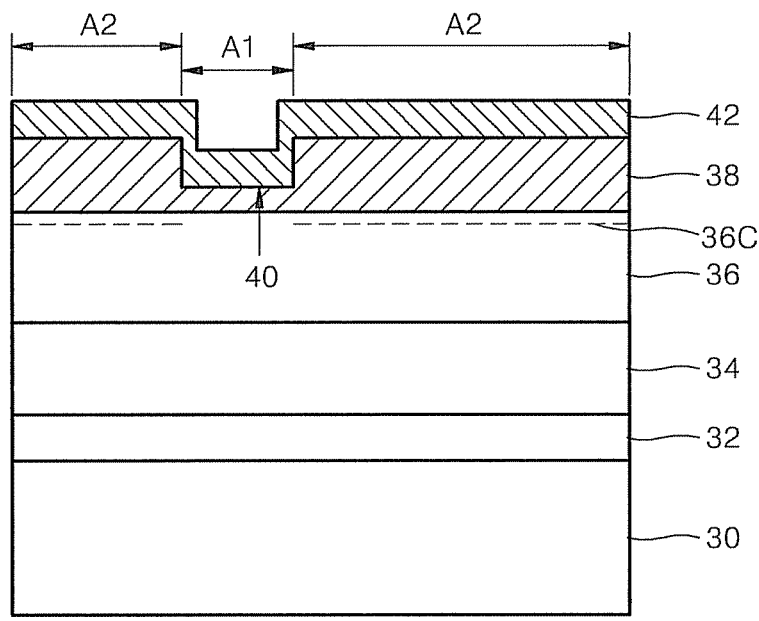
Figure 4:
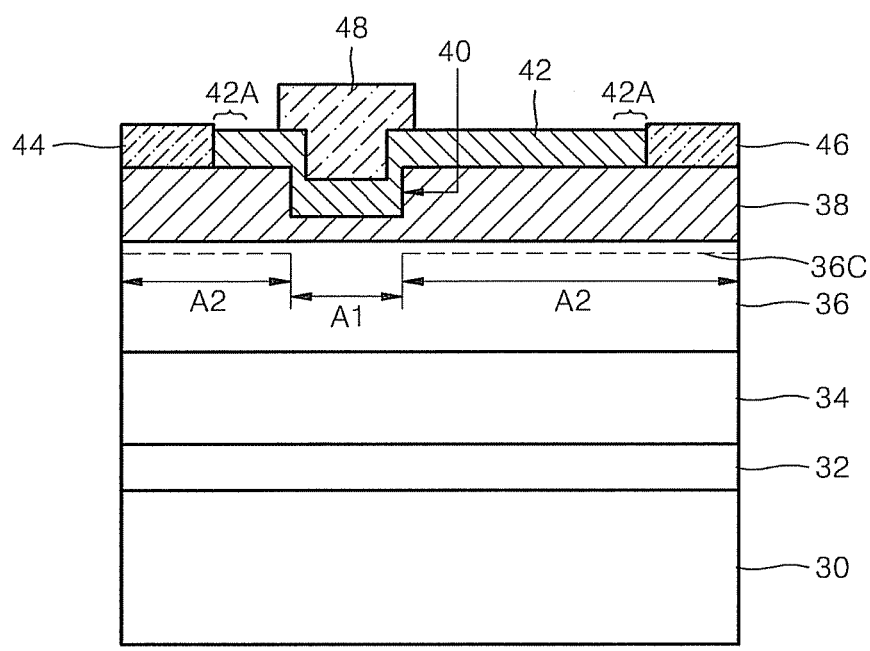

FIGS. 1-4 are cross-sectional diagrams illustrating methods of manufacturing Enhancement-mode (E-mode) high electron mobility transistors (HEMTs) according to example embodiments. FIG. 4 illustrates high electron mobility transistors (HEMTs) manufactured according to the methods illustrated in FIGS. 1-4. Referring to FIG. 4, a seed layer 32 may be on a substrate 30. The seed layer 32 may be a base layer for growing material layers (e.g., a buffer layer 34) thereon. The buffer layer 34 may be on the seed layer 32. The buffer layer may be, for example, an AlGaN layer, an AlInN layer and/or an AlGaInN layer. An aluminum content of the buffer layer may be in the range of about 0 atomic % to about 30 atomic %.

A channel layer 36 may be on the buffer layer 34. The channel layer 36 may be a semiconductor layer, for example, a compound semiconductor layer (e.g., a GaN layer). The channel layer 36 may not be a semiconductor layer, for example, if the 2-Dimensional Electron Gas (2DEG) may be generated from a material layer (e.g., a buffer layer). A barrier layer 38 may be on the channel layer 36. The channel layer 36 may include a 2DEG 36C below or at an interface between the channel layer 36 and the barrier layer (e.g., where the channel layer contacts the barrier layer 38). The 2DEG 36C may be used as, for example, an n-channel. The 2DEG 36C may be generated by polarization charges (not shown) of the barrier layer 38. The barrier layer 38 may be a layer for inducing an n-channel in the channel layer 36 and may be called a channel supplying layer. The barrier layer 38 may be, for example, an n-doped material layer.

The barrier layer 38 may be a semiconductor layer and/or an insulation layer. For example, the barrier layer 38 may be an AlN layer, an AlGaN layer, an AlInN layer, an AlGaInN layer and combinations thereof. The barrier layer 38 may include a double layer including an upper layer 38A and a lower layer 38B (e.g., see FIG. 6) in regions except for a gate electrode region (e.g., a region where a gate electrode is formed). A material of the upper layer 38A may be different from a material of the lower layer 38B. For example, an aluminum content of the upper layer 38A may be different from an aluminum content of the lower layer 38B. An aluminum content of the upper layer 38A of the double layer may be greater than an aluminum content of the lower layer 38B. As an aluminum content is increased a polarization ratio may be increased. When the barrier layer 38 includes a double layer (e.g., an upper layer 38A and a lower layer 38B), a total thickness of the barrier layer 38 may be reduced.

A thickness of the barrier layer 38 may be different in first and second regions A1 and A2. The gate electrode 48 may be on the first region A1. A second region A2 may be a peripheral region of the gate electrode 48. The second region A2 may be a region between the gate electrode 48, and source/drain electrodes 44 and 46. The source/drain electrodes 44 and 46 may be on the second region A2. A thickness t1 of the barrier layer 38 in the first region A1 may be thinner than that of the barrier layer 38 in the second region A2. The barrier layer 38 in the first region A1 may include a recess region 40. For example, a thickness of the barrier layer 38 in the first region A1 may be about 5 nm to about 20 nm. A thickness of the barrier layer 38 in the second region A2 may be greater than about 20 nm (e.g., about 20 nm to about 100 nm).

A depletion layer 42, the source electrode 44 and the drain electrode 46 may be on the barrier layer 38. The depletion layer 42 may cover the surface of the first region A1. For example, the depletion layer 42 may cover the recess region 40 of the barrier layer 38 and may extend onto the second region A2. There may be a 2-Dimensional Hole Gas (2DHG) in a portion of the depletion layer 42 in the second region A2 due to negative polarization charges of the barrier layer 38. The 2DHG in a portion on the first region A1 of the depletion layer 42 may be depleted upon depletion of the 2DEG in the channel layer 38 in the first region A1. A concentrated electric field may be prevented and/or reduced at the gate electrode 48 by space charges.

A portion 42A adjacent to the source and drain regions 44 and 46, of portions of the depletion layer 42 extending onto the second region A2, may be removed. The depletion layer 42, the source electrode 44, and the drain electrode 46 may be a distance apart from each other (not shown). The depletion layer 42 may raise an energy band of the barrier layer 38 (e.g., may raise an energy level of the barrier layer 38). As an energy level of the barrier layer 38 is raised by the depletion layer 42, an energy level of the channel layer 36 may be raised simultaneously. The degree to which the energy levels of the barrier layer 38 and the channel layer 36 increase may vary according to a thickness of the barrier layer 38.

Figure 7:
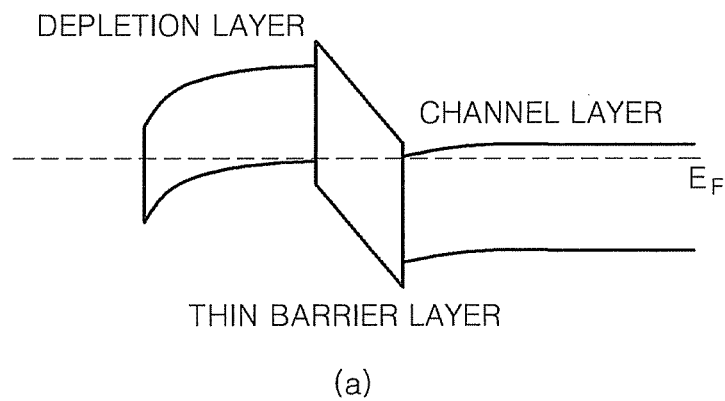
Figure 7:
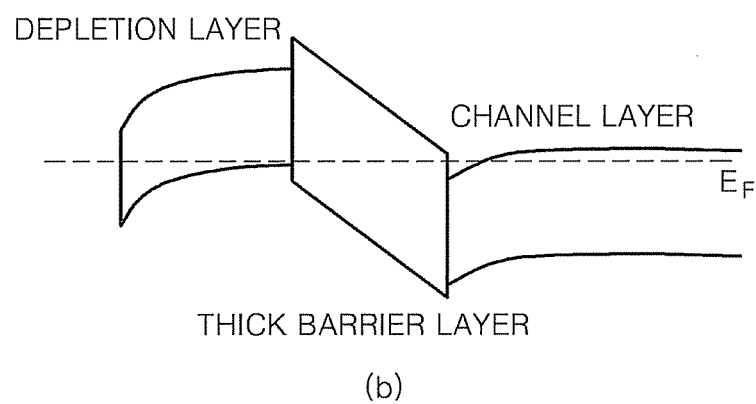

FIG. 7 is a diagram illustrating energy level changes of a barrier layer and a channel layer according to the presence of a depletion layer and a thickness of the barrier layer. Referring to FIG. 7, due to the presence of the depletion layer 42, an energy level of the barrier layer 38 and an energy level of the channel layer 36 in the first region A1 of the barrier layer 38 may be raised above the Fermi level ($E_F$) as shown in FIG. 7(a). Energy levels of the barrier layer 38 and the channel layer 36 in the second region A2 of the barrier layer 38 may also be raised but not above $E_F$. As shown in FIG. 7(b), an energy level of the interface between the barrier layer 38 and the channel layer 36 in the second region A2 may be below the Fermi level ($E_F$). The channel layer 38 in the second region A2 may not be affected by the depletion layer 42. The 2DEG 36C in the first region A1 may be depleted in the channel layer 36 and the HEMT may operate in an E-mode. The 2DEG 36C in the second region A2 may maintain about a same concentration as before the inclusion of the depletion layer 42 without concentration decrease and/or with a negligible concentration decrease.

The depletion layer 42 may be, for example, a p-doped layer or an undoped layer. The depletion layer 42 may be, for example, a p-type semiconductor layer or a dielectric layer. For example, the depletion layer 42 may be a GaN layer, an InN layer, an AlGaN layer, an AlInN layer, an InGaN layer and/or an AlInGaN layer. A material layer including indium (In) may be used as the depletion layer 42 without p-doping. A gate electrode 48 may be on the depletion layer 42. The gate electrode 48 may be in the first region A1. The gate electrode 48 may be, for example, a p-metal or nitride electrode. The p-metal may be, for example, nickel (Ni), iridium (Ir), platinum (Pt) and/or gold (Au). The nitride may be, for example, TiN, TaN and/or ZrN. A structure of the gate electrode 48 may be a double layered structure. A distance between the drain electrode 46 and the gate electrode 48 may be greater than a distance between the source electrode 44 and the gate electrode 48.

Referring to FIG. 1, a seed layer 32, a buffer layer 34, a channel layer 36, and a barrier layer 38 may be formed (e.g., sequentially formed) on a substrate 30. The substrate 30 may be, for example, a Si substrate, a SiC substrate and/or an $Al_2O_3$ substrate. The seed layer 32 may be, for example, an AlN layer and/or an AlGaN layer. The seed layer 32 may be one or more of various kinds of materials according to a material formed thereon. The buffer layer 34, the channel layer 36, and the barrier layer 38 may be formed of, for example, materials described with reference to FIG. 4. The barrier layer 38 may be a material layer with a higher polarization rate (higher polarizability) than the channel layer 36. A 2DEG may be induced in the channel layer 36 due to the barrier layer 38. Even if a depletion layer (e.g., a depletion layer 42) is formed on the barrier layer 38, the barrier layer 38 may be formed to a thickness at which a concentration of the 2DEG 36C may not be reduced (e.g., the 2DEG remains). For example, the barrier layer 38 may be formed to a thickness greater than about 20 nm.

Referring to FIG. 2, after the forming of the barrier layer 38 a recess 40 may be formed to a depth in the first region A1 of the barrier layer 38. The recess 40 may be formed to a depth that does not effect the 2DEG 36C below the first area A1. After the forming of the recess 40, the thickness t1 in the first region A1 (e.g., the thickness t1 of the barrier layer 38 in the first region A1) may be thinner than the thickness t2 of the second region A2. Referring to FIG. 3, a depletion layer 42 may be grown and/or deposited on the barrier layer 38. The depletion layer 42 may be grown to cover the surface of the barrier layer 38 in the recess 40 and the surface of the barrier layer 38 in the second region A2. The depletion layer 42 may be formed to a thickness of about 50 nm to about 200 nm.

Because the barrier layer 38 may be thin in the first region A1 relative to a thickness of the barrier layer 38 in the second region A2, a 2DEG in the channel layer 36 in first region A1 may be depleted when the depletion layer 42 is formed. Among 2DHGs (not shown) occurring in the depletion layer 42 due to the barrier layer 38, a 2DHG occurring in a portion corresponding to the first region A1 may be depleted simultaneously with the 2DEG in the first region A1. Referring to FIG. 4, in order to secure a region for the source electrode 44 and the drain electrode 46, a portion of the barrier layer 38 may be exposed by removing a portion of the depletion layer 42 spaced apart from the first region A1 in the second region A2. The source electrode 44 and the drain electrode 46 may be formed on the exposed region of the barrier layer 38. A portion 42A of the depletion layer 42 adjacent to the source electrode 44 and the drain electrode 46 may be removed (not shown) during the removing of a portion of the depletion layer 42, so that the source electrode 44 and the drain electrode 46 may not be in contact with the depletion layer 42. A gate electrode 48 may be formed on the depletion layer 42 in the recess 40.

The barrier layer 38 may be formed with a plurality of layers according to at least one method described with respect to FIGS. 1-4. For example, referring to FIG. 5, the barrier layer 38 may be formed by forming (e.g., sequentially growing) first and second barrier layers 38A and 38B on the channel layer 36. A thickness of the first barrier layer 38A may be identical to that of the barrier layer 38 (e.g., t1) in the first region A1. The first barrier layer 38A may be referred to as a lower layer 38A and the second barrier layer 38B may be referred to as an upper layer 38B. A polarization rate of the second barrier layer 38B may be greater than that of the first barrier layer 38A. An aluminum content of the second barrier layer 38B may be greater than that of the first barrier layer 38A.

Figure 5:
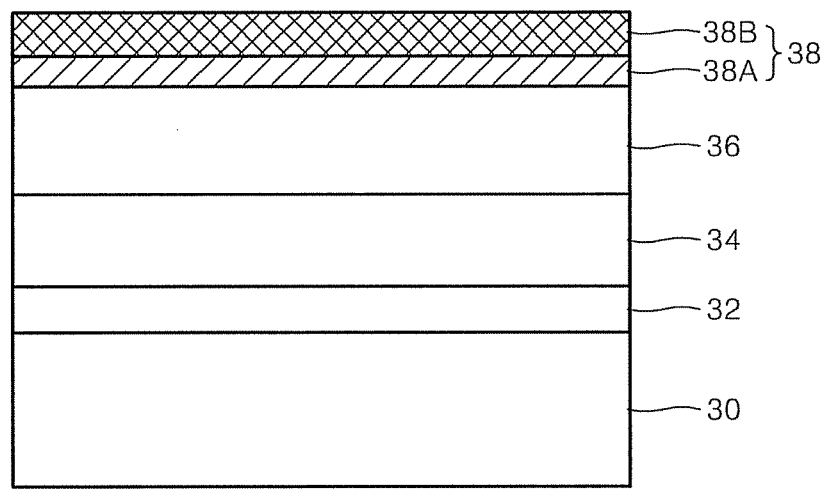

A total thickness of the double-layered barrier layer 38 may be reduced as compared to a barrier layer 38 including a single layer (e.g., corresponding to a material of the first barrier layer 38A). For example, If the first and second barrier layers 38A and 38B are an AlGaN layer, the first barrier layer 38A may be an AlGaN layer with a thickness of about 12 nm and an aluminum content of about 20%, and the second barrier layer 38B may be an AlGaN layer with a thickness of about 20 nm and an aluminum content of about 30%. A depletion layer 42 may be a p-GaN layer with a thickness of about 70 nm. Although FIG. 5 illustrates that the barrier layer 38 may include two layers, example embodiments are not so limited and the barrier layer 38 may be formed of more than three layers with, for example, respectively different polarization rates.

Figure 6:
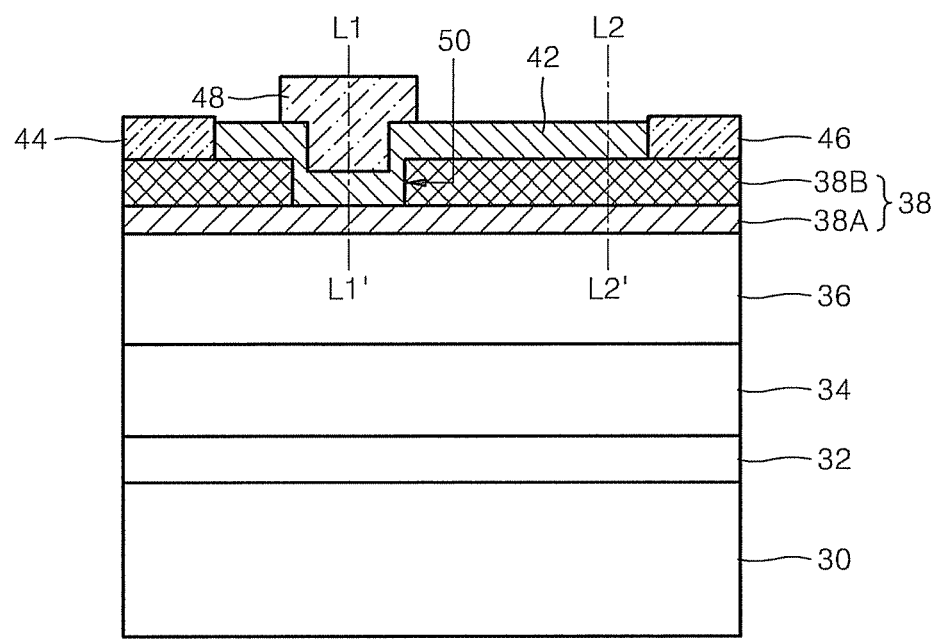

Referring to FIG. 6, a portion corresponding to the first region A1 of FIG. 2 may be removed from the second barrier layer 38B. A recess 50 exposing the first barrier layer 38A may be formed in the barrier layer 38. Subsequent processes may be the same or similar to those described with reference to FIGS. 3 and 4.

Figure 8:
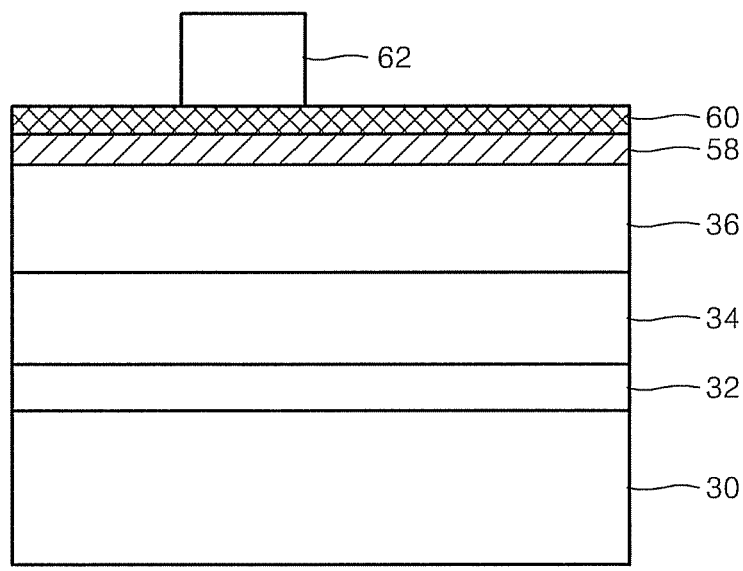

FIGS. 8-11 are cross-sectional diagrams illustrating methods of manufacturing E-mode HEMTs according to other example embodiments. Referring to FIG. 8, a seed layer 32, a buffer layer 34, and a channel layer 36 may be formed (e.g., sequentially formed) on a substrate 30. A barrier layer 58 may be formed on the channel layer 36. The barrier layer 58 may be formed using, for example, an epitaxial growth method. The barrier layer 58 may be formed to the thickness t1 (e.g., identical to the thickness t1) of the barrier layer 38 in the first region A1 as illustrated FIG. 2 and/or that of the first barrier layer 38A of FIG. 5. A depletion layer 60 may be formed on the barrier layer 58. The depletion layer 60 may be formed, for example, using an epitaxial growth method.

Figure 9:
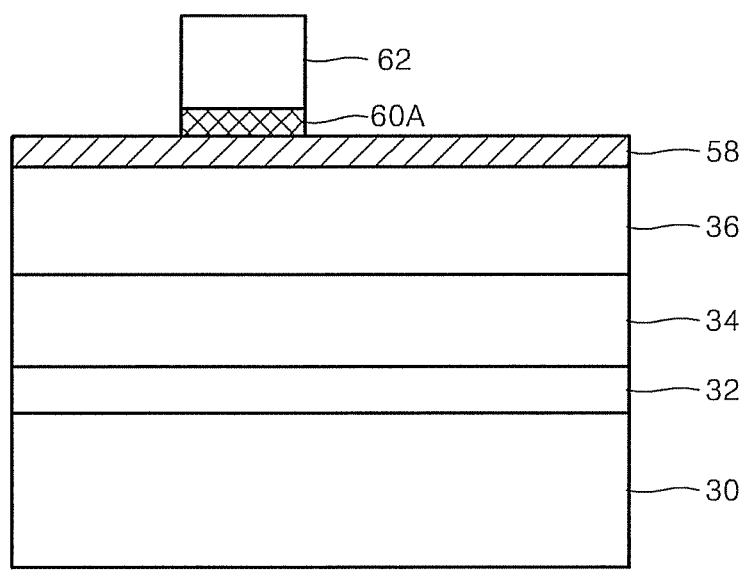

A purpose of the depletion layer 60 may be the same as a purpose of the depletion layer 42 of FIG. 3, and may be formed of the same or similar material to the depletion layer 42. A mask 62 may be formed on the depletion layer 60. The mask 62 may be a photosensitive pattern defining a gate region. The depletion layer 60 may be removed (e.g., etched) in areas other than those protected by the mask 62. The etch may be performed until the barrier layer 58 is exposed. As a result of the etch, as shown in FIG. 9, a depletion pattern 60a covering a region of the barrier layer 58 remains on the barrier layer 58. The mask 62 may be removed.

Figure 10:
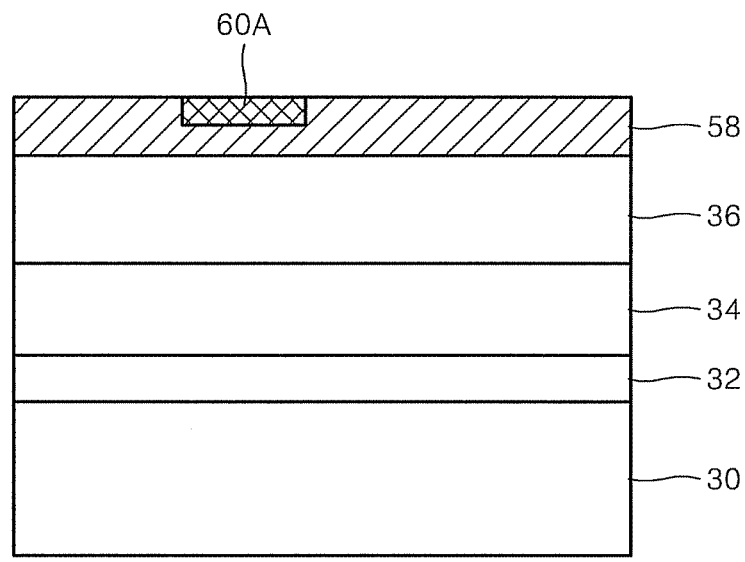
Figure 11:
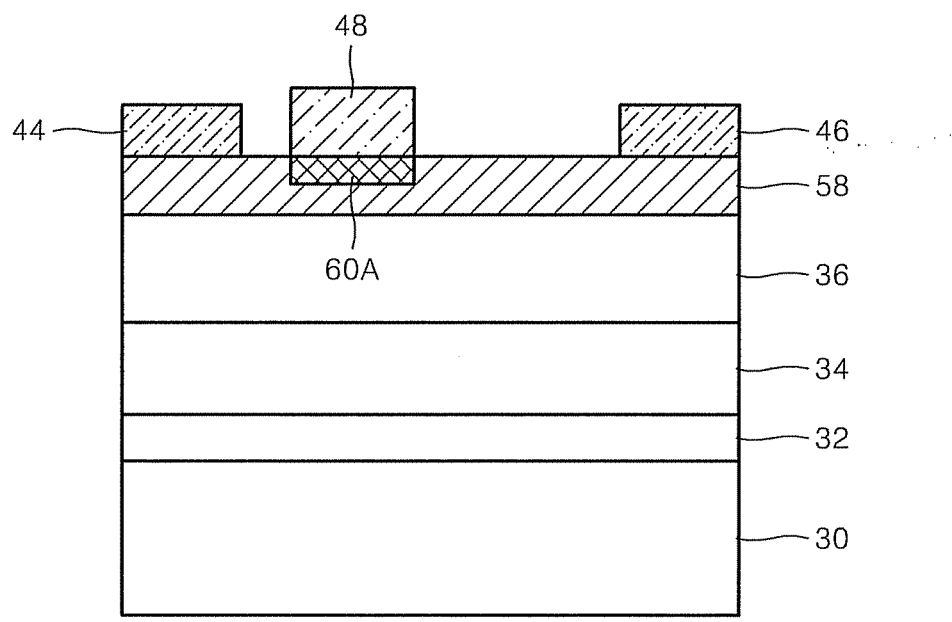

Referring to FIG. 10, the barrier layer 58 may be grown around the depletion pattern 60A. The barrier layer 58 may be formed to a total thickness of more than about 20 nm around the depletion pattern 60A. A thickness of the barrier layer 58 around the depletion pattern 60A may be the thickness t2 of the barrier layer 38 in the second region A2 of FIG. 2. When the barrier layer 58 is grown around the depletion patter 60A, an aluminum content of an additionally grown portion of the barrier layer 58 may be greater than that of previously formed portion of the barrier layer 58. A thickness of the depletion layer 60 may be determined such that the additionally grown barrier layer 58 does not cover the depletion layer pattern 60A. Hereinafter, description of the barrier layer 58 is of the barrier layer 58 including the additionally grown portion. Referring to FIG. 11, a source electrode 44 and a drain electrode 46 may be formed on the barrier layer 58. A gate electrode 48 may be formed on the depletion layer pattern 60A. The source electrode 44 and the drain electrode 46 may be formed spaced apart from the gate electrode 48.

Figure 12:
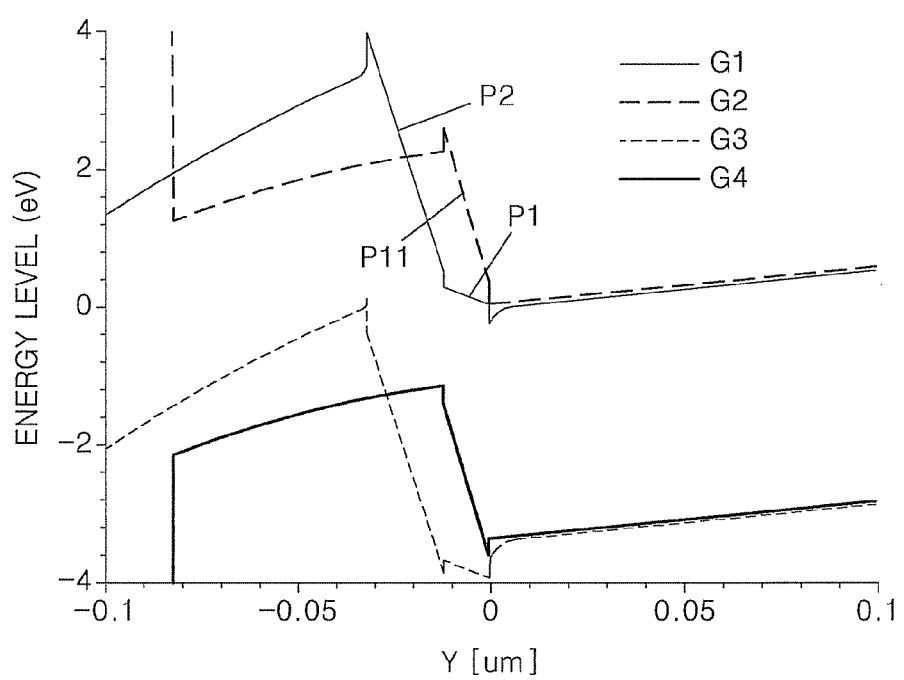
Figure 13:
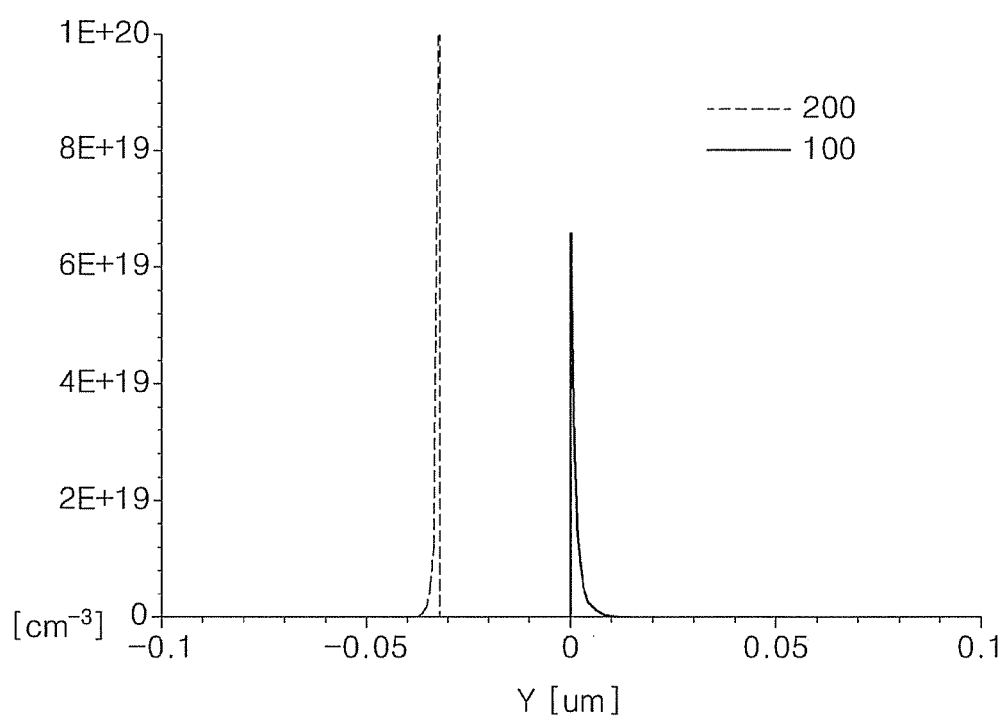

FIGS. 12 and 13 are diagrams illustrating a T-CAD simulation result with respect to the HEMT of FIG. 6. In the simulation, the channel layer 36 may be a GaN layer and the first barrier layer 38A may be an $Al_{20}GAN$ layer of about 12 nm. The second barrier layer 38B may be an $Al_{35}GaN$ layer of about 20 nm. The depletion layer 42 may be a p-GaN layer of about 70 nm. FIG. 12 may be a diagram illustrating an energy level change with respect to materials in directions L1-L1' and L2-L2' of the HEMT of FIG. 6. FIG. 13 may be a diagram illustrating a carrier concentration according to the depth of the direction L2-L2' of FIG. 6. In the direction L1-L1', there is the channel layer 36, the first barrier layer 38A, the depletion layer 42, and the gate electrode 48. In the direction L2-L2', there is the channel layer 36, the first and second barrier layers 38A and 38B, and the depletion layer 42.

Referring to FIG. 12, an x-axis may represent a depth in the direction L1-L1' and a y-axis may represent an energy level eV. In FIG. 12, a first graph G1 may represent an energy level change according to the depth in the direction L2-L2' and a second graph G2 may represent an energy level change according to the depth in the direction L1-L1'. A first portion P1 of the first graph G1 may represent an energy level of an $Al_{20}GaN$ layer used as the first barrier layer 38A and a second portion P2 of the first graph G1 may represent an energy level of an $Al_{35}GaN$ layer that may be used as the second barrier layer 38B. The right side of the first portion P1 may represent an energy level of the GaN channel layer 36 and the left side of the second portion P2 may represent an energy level of the p-GaN depletion layer 42.

In the second graph G2, a first portion P11 may represent an energy level of the first barrier layer 38A, the left side of the first portion P11 may represent an energy level of a p-GaN depletion layer 42, and the right side of the first portion P11 may represent an energy level of the channel layer 36. In FIG. 12, third and fourth graphs G3 and G4 may represent an energy level change and may illustrate the presence or absence of a 2DHG. The third graph G3 may represent an energy level change according to the depth of the direction L2-L2' and the fourth graph G4 may represent an energy level change according to the depth of the direction L1-L1'.

Comparing the first and second graphs G1 and G2, there may be no 2DEG in the channel layer 36 in the direction L1-L1' and there may be 2DEG in the channel layer 36 in the direction L2-L2'. Comparing the third and fourth graphs G3 and G4, there may be no 2DHG in the depletion layer 42 in the direction L1-L1' and there may be 2DHG in the depletion layer 42 in the direction L2-L2'. Referring to FIG. 13, a first peak 100 may represent a carrier concentration of the channel layer 36 in the direction L2-L2' (e.g., a 2DEG concentration) and a second peak 200 may represent a carrier concentration of the depletion layer 42 in the direction L2-L2' (e.g., a 2DHG concentration). The 2DEG may be depleted in the channel layer 36 in the direction L1-L1' but there may be 2DEG of a high concentration in the channel layer 36 in the direction L2-L2'.

According to one or more example embodiments, a recess process may not be performed for 2DEG depletion in a HEMT and a channel layer may not be damaged during a process for forming an E-mode HEMT. Although a 2DEG may be depleted in the channel layer below the gate electrode, with the depletion layer between the gate electrode and the channel layer, the barrier layer between the gate electrode and the source/drain may be thick so that a concentration of the 2DEG is not reduced in a region of the channel layer adjacent to the gate electrode. An on-current of the HEMT may not be reduced.

While example embodiments have been particularly shown and described, it will be understood by one of ordinary skill in the art that variations in form and detail may be made therein without departing from the spirit and scope of the claims.

What is claimed is:

1. A High Electron Mobility Transistor (HEMT), comprising:
    a channel layer including a 2-Dimensional Electron Gas (2DEG);
    a barrier layer configured to induce the 2DEG in the channel layer, the barrier layer including a recess region,
    the barrier layer including a first barrier layer on the channel layer and a second barrier layer on the first barrier layer;
    source and drain electrodes on the barrier layer;
    a depletion layer on the barrier layer between the source and drain electrodes, the depletion layer covering a surface of the barrier layer in the recess region and extending onto a region of the barrier layer outside the recess region,
    the depletion layer including at least one of a GaN layer, an InN layer, an AlGaN layer, an AlInN layer, an InGaN layer and an AlInGaN layer; and
    a gate electrode on the depletion layer in the recess region,
    wherein a polarization rate of the second barrier layer is greater than a polarization rate of the first barrier layer.

2. The HEMT of claim 1, wherein a thickness of the barrier layer in the recess region is about 5 nm to about 20 nm.

3. The HEMT of claim 1, wherein the barrier layer is at least one of an AlN layer, an AlGaN layer, an AlInN layer and an AlInGaN layer.

4. The HEMT of claim 1, wherein the depletion layer is a p-doped layer.

5. The HEMT of claim 1, wherein the gate electrode includes at least one of a p-metal and a nitride.

6. The HEMT of claim 1, wherein the depletion layer contacts sidewalls of the gate electrode, and at least one of the source and drain electrodes.

7. A method of manufacturing a high electron mobility transistor (HEMT), the method comprising:
    forming a channel layer;
    forming a barrier layer to induce a two-dimensional electron gas (2DEG) in the channel layer, the barrier layer including a first barrier layer on the channel layer and a second barrier layer on the first barrier layer;
    forming a recess in the barrier layer;
    forming a depletion layer to cover a surface of the barrier layer in the recess and to extend onto regions of the barrier layer adjacent to the recess,
    the depletion layer including at least one of a GaN layer, an InN layer, an AlGaN layer, an AlInN layer, an InGaN layer and an AlInGaN layer;
    forming source and drain electrodes on the barrier layer; and
    forming a gate electrode on the depletion layer,
    wherein a polarization rate of the second barrier layer is greater than a polarization rate of the first barrier layer.

8. The method of claim 7, further comprising:
    sequentially-stacking a seed layer and a buffer layer on a substrate,
    wherein the forming a channel layer includes forming the channel layer on the buffer layer.

9. The method of claim 7, wherein the forming a barrier layer includes forming the barrier layer to a thickness of about 20 nm to about 100 nm.

10. The method of claim 7, wherein forming a recess in the barrier layer includes recessing the barrier layer to a thickness of about 5 nm to about 20 nm.

11. The method of claim 7, wherein the forming a recess includes removing a portion of the second barrier layer corresponding to the gate electrode.

12. The method of claim 7, wherein the forming source and drain electrodes includes forming the source and drain electrodes a distance apart from the depletion layer.

13. The method of claim 7, wherein the depletion layer contacts sidewalls of the gate electrode, and at least one of the source and drain electrodes.

14. A method of manufacturing a high electron mobility transistor (HEMT), the method comprising:
    forming a channel layer;
    forming a first barrier layer to induce a two-dimensional electron gas (2DEG) in the channel layer;
    forming a depletion layer pattern on the first barrier layer;
    growing a second barrier layer on the first barrier layer around the depletion layer pattern;
    forming source and drain electrodes on the second barrier layer; and
    forming a gate electrode on the depletion layer pattern.

15. The method of claim 14, wherein the forming a depletion layer pattern includes:
    forming a depletion layer covering a top surface of the first barrier layer; and
    patterning the depletion layer to form the depletion layer pattern.

16. The method of claim 14, wherein the forming a first barrier layer includes forming the first barrier layer to a thickness of about 5 nm to about 20 nm.

17. The method of claim 14, wherein the growing a second barrier layer includes growing the second barrier layer to a thickness of about 20 nm to about 100 nm.

18. The method of claim 15, wherein the growing the second barrier layer includes growing the second barrier layer until an uppermost surface of the second barrier layer is level with an uppermost surface of the depletion layer.

* * * * *